United States Patent
Newhart

(10) Patent No.: US 7,734,991 B1
(45) Date of Patent: Jun. 8, 2010

(54) METHOD OF ENCODING SIGNALS WITH BINARY CODES

(75) Inventor: Donald W. Newhart, Elkridge, MD (US)

(73) Assignee: The United States of America as represented by the Director, National Security Agency, Washington, DC (US)

( * ) Notice: Subject to any disclaimer, the term of this patent is extended or adjusted under 35 U.S.C. 154(b) by 826 days.

(21) Appl. No.: 11/650,760

(22) Filed: Jan. 4, 2007

(51) Int. Cl.
*H03M 13/00* (2006.01)

(52) U.S. Cl. ........................ 714/781; 714/758

(58) Field of Classification Search ............. 714/758, 714/781, 782, 784
See application file for complete search history.

(56) References Cited

U.S. PATENT DOCUMENTS

| | | | | |
|---|---|---|---|---|
| 4,030,067 A | * | 6/1977 | Howell et al. | 714/758 |
| 4,694,455 A | * | 9/1987 | Koga | 714/782 |
| 5,343,481 A | * | 8/1994 | Kraft | 714/782 |
| 5,430,739 A | * | 7/1995 | Wei et al. | 714/784 |
| 5,440,570 A | * | 8/1995 | Wei et al. | 714/782 |
| 6,615,387 B1 | * | 9/2003 | Williamson et al. | 714/785 |
| 6,971,056 B1 | * | 11/2005 | Classon et al. | 714/782 |
| 7,058,876 B1 | * | 6/2006 | Ireland et al. | 714/781 |
| 7,096,408 B1 | * | 8/2006 | Ireland et al. | 714/784 |

OTHER PUBLICATIONS

U.S. Appl. No. 09/976,731, filed May 29, 2003, Song.
U.S. Appl. No. 10/092,407, filed Jan. 16, 2003, Morioka et al.
U.S. Appl. No. 10/202,252, filed Jan. 29, 2004, Argon et al.
U.S. Appl. No. 10/301,769, filed Jun. 5, 2003, Jarchi et al.
U.S. Appl. No. 11/543,282, Kline et al.
Shu Lin and Daniel Costello, Jr; "Error Control Coding Fundamentals and Applications," Chapter 6: Binary BCH Codes, Person Prentice Hall, 2nd Ed., pp. 194-195, 224-225, 2004.
Kogo, Keiichiro; "A Simple Decoding of BCH Codes over GF(2m),"; IEEE Transactions on Communications, vol. 46, No. 6, Jun. 1998.

* cited by examiner

*Primary Examiner*—Esaw T Abraham
(74) *Attorney, Agent, or Firm*—Eric Froehlich; Robert D Morelli

(57) ABSTRACT

A method of encoding a communication signal by selecting a cyclic code, establishing a generator polynomial, generating a polynomial using the generator polynomial, forming a matrix from the generated polynomial, receiving data to be encoded, appending zeros to the received data, calculating a syndrome of the matrix, calculating check values from the syndrome, appending the check values to the received data, and encoding the received data with appended check values using the generator polynomial.

2 Claims, 2 Drawing Sheets

METHOD OF ENCODING SIGNALS WITH BINARY CODES

FIELD OF THE INVENTION

The present invention relates, in general, to error detection and correction, and, in particular to forward correction by block codes.

BACKGROUND OF THE INVENTION

When messages are transmitted over a communication network, errors in transmission may occur. To detect and correct these errors, each transmitted message is modified, adding a pre-determined error-correcting scheme to the message. After the message is received, the message must be decoded.

Common types of codes used include block codes, such as Reed-Solomon and Bose Chaudhuri Hocquenghem (BCH) codes. BCH codes are a commonly used multi-level cyclic variable length code used in error correction schemes.

The encoded message is normally grouped by codeword. A codeword is generally comprised of n symbols, further comprising k information symbols, which results in n−k redundant symbols. For BCH codes, $n=2^m-1$, and $k \geq n-mt$. To correct for t bits, mt bits of redundancy are needed.

U.S. patent application Ser. No. 09/976,731, entitled "LOW COMPLEXITY AND LOW POWER FEC SUPPORTING HIGH SPEED PARALLEL DECODING OF SYNDROME-BASED FEC CODES," discloses a method of reducing power consumption and complexity when performing forward error correction by using parallel decoding techniques. The present invention is not designed to process error codes using parallel decoding techniques. U.S. patent application Ser. No. 09/976,731 is hereby incorporated by reference into the specification of the present invention.

U.S. patent application Ser. No. 10/092,407, entitled "SIGNAL PROCESSING METHOD, SIGNAL PROCESSING SYSTEM, PROGRAM FOR SIGNAL PROCESSING, AND COMPUTER-READABLE STORAGE MEDIUM ON WHICH THIS PROGRAM IS RECORDED," discloses a signal processing method for processing 40 Gbps or higher communication signals. The method calculates a Yule-Walker equation that has elements of a Galois field, and solves the equation using Jacobi's formula to obtain symmetric matrices. The number of errors is determined to be the maximum matrix size that corresponds to the non-zero solution. The method then determines if the number of errors equals the number of correctable errors. The present invention does not determine the number of errors and decide if the number of errors is correctable. U.S. patent application Ser. No. 10/092,407 is hereby incorporated by reference into the specification of the present invention.

U.S. patent application Ser. No. 10/202,252, entitled "EFFICIENT DECODING OF PRODUCT CODES," discloses a decoding system that generates test pattern syndrome and subsequent test pattern syndromes using a recursive function of the syndromes previously generated. The present invention does not generate syndromes using a recursive function of the syndromes previously generated. U.S. patent application Ser. No. 10/202,252 is hereby incorporated by reference into the specification of the present invention.

U.S. patent application Ser. No. 10/301,769, entitled "ERROR CORRECTION IMPROVEMENT FOR CONCATENATED CODES," discloses a multiple dimension codeword. Decoding is performed in multiple passes for each dimension, wherein the corrected data of the previous pass used as an input to subsequent passes. The present invention does not encode data in multiple dimensions. U.S. patent application Ser. No. 10/301,769 is hereby incorporated by reference into the specification of the present invention.

U.S. patent application No. 11/543,282, entitled "METHOD OF DECODING SIGNALS HAVING BINARY BCH CODES," discloses a method of correcting a communication signal with BCH product codes. The method comprises the steps of receiving a codeword vector, establishing a generator polynomial, establishing a check polynomial, calculating a binary-matrix, and calculating the binary syndrome $S=Hr^t$. U.S. patent application Ser. No. 11/543,282 is hereby incorporated by reference into the specification of the present invention.

Known non-patent publications include:

Error Control Coding, Fundamentals and Applications, Chapter 6: Binary BCH Codes, Shu Lin and Daniel J. Costello, Jr., Pearson Prentice Hall, second edition, pp. 194-195, 224-225, 2004; and A Simple Decoding of BCH Codes over $GF(2^m)$, Keiichiro Kogo, IEEE Transactions on Communications, vol. 46, no. 6, June 1998.

SUMMARY OF THE INVENTION

It is an object of the present invention to provide a method of rapidly encoding block codes in a communication signal.

It is another object of the present invention to provide a method of encoding block codes that is especially useful when for long, high-rate codes processed in software.

It is still another object of the present invention to provide a method that adapts well to shortened cyclic codes, and application to the calculation of checksums for Cyclic Redundancy Check Codes (CRC's).

The first step of the present invention is selecting a user-definable binary cyclic code. The user-definable binary cyclic code has a user-definable length n and a user-definable dimension k.

The second step is establishing a generator polynomial $g(x)$ having coefficients $(g_0, g_1, g_2, \ldots, g_{n-k})$.

The third step is setting $$h(x) = \frac{(x_n - 1)}{g(x)}$$

with coefficients $(h_0, h_1, h_2, \ldots, h_k)$ and forming $H = \begin{bmatrix} h_k & h_{k-1} & h_{k-2} & \ldots & h_0 & 0 & 0 & \ldots & 0 \\ 0 & h_k & h_{k-1} & \ldots & h_1 & h_0 & 0 & \ldots & 0 \\ \ldots & \ldots & \ldots & \ldots & \ldots & & & \ldots & 0 \\ 0 & 0 & \ldots & h_k & h_{k-1} & h_{k-2} & \ldots & h_0 & 0 \\ 0 & 0 & \ldots & 0 & h_k & h_{k-1} & \ldots & h_1 & h_0 \end{bmatrix}$.

The fourth step is receiving data to be encoded. The data has coefficients $(a_1, a_2, \ldots, a_k)$.

The fifth step is appending (n−k) zeros to the received data forming an n-long vector, $\vec{r} = (0, 0, \ldots, a_1, a_2, \ldots, a_k)$.

The sixth step is calculating the binary syndrome $\vec{s} = H\vec{r}^t$ by performing an exclusive-OR function of (n−k) segments of $(r_0, r_1, r_2, \ldots, r_{n-1})$ according to the coefficients $(h_0, h_1, h_2, \ldots, h_k)$.

The seventh step is calculating the (n−k) check values $L\vec{s}^t$. In this step, $$L = \begin{bmatrix} g_{n-k} & g_{n-k-1} & g_{n-k-2} & \cdots & g_1 \\ 0 & g_{n-k} & g_{n-k-1} & \cdots & g_2 \\ 0 & 0 & & \cdots & \cdots \\ 0 & 0 & \cdots & g_{n-k} & g_{n-k-1} \\ 0 & 0 & \cdots & 0 & g_{n-k} \end{bmatrix}.$$

The eighth step is appending the received data with the (n−k) check values calculated in the seventh step.

The ninth, and last step, is encoding the received data using the generator polynomial established in the second step.

DETAILED DESCRIPTION

Figure 1:
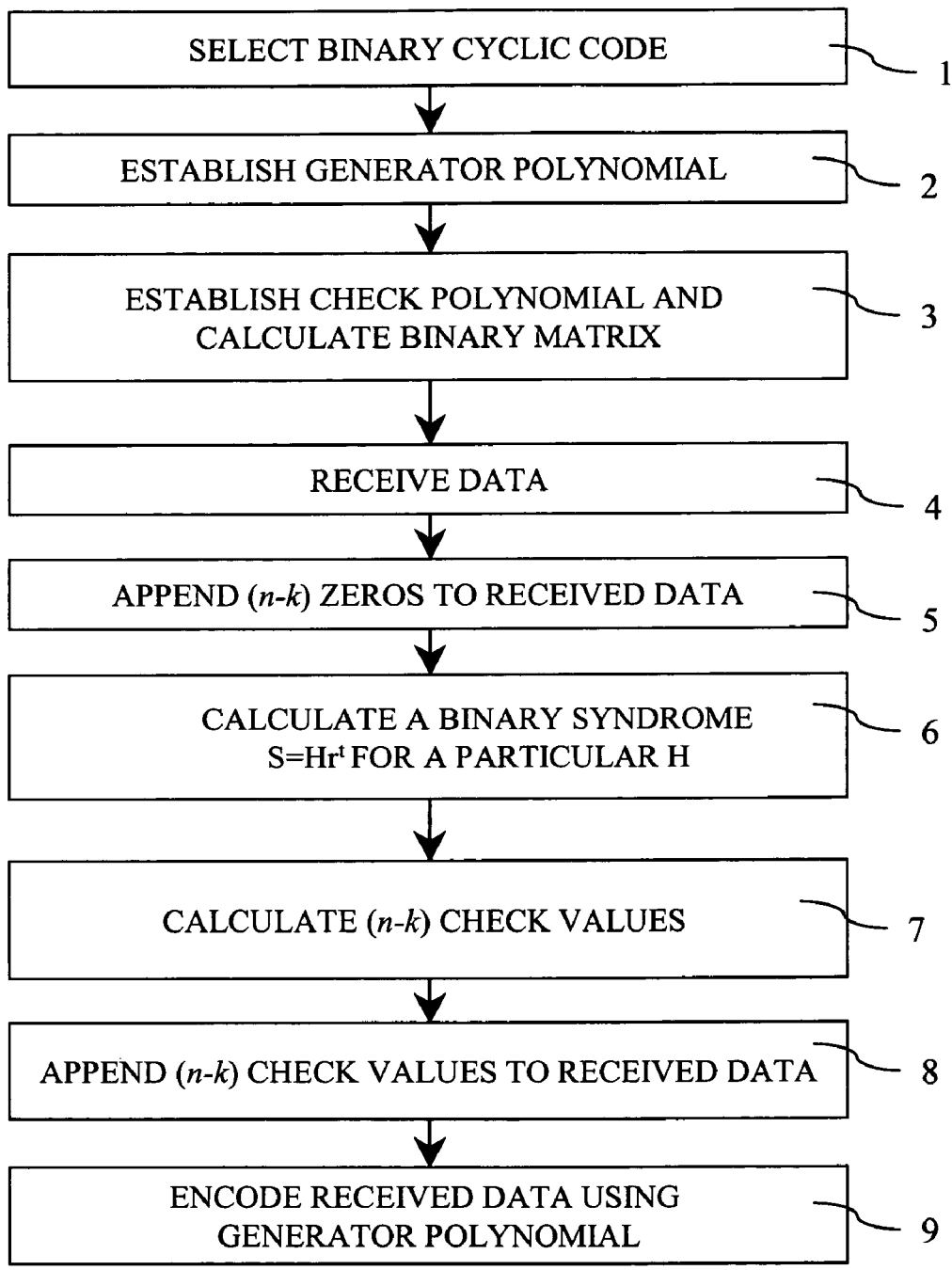
FIG. 1 is a flowchart of the steps of the present invention.

The present invention is a novel method of encoding binary cyclic codes. The present invention is performed on a computer and provides a software technique to encode data using binary cyclic codes.

An ordinary (binary) syndrome is derived from the dot products of a received vector with a binary basis for the orthogonal space. The syndrome sequence is a polynomial evaluation in a finite extension field, which is needed for the Berlekamp-Massey decoding algorithm. While a nonzero syndrome in either case only arises when an error has occurred, the syndrome sequence allows efficient calculation of the error values without the large tables that a simple syndrome decoder would require. The relevance of this connection for processing BCH codes hinges on an intrinsic software advantage from choosing the dual code basis to be consecutive cyclic shifts of the check polynomial, which is available for any cyclic code. The inherent parallelism that this affords by itself makes this strategy superior in the case that error-free blocks are common, for example, in a particular signal in which the first-stage decoding of an LDPC code handles many error patterns before BCH decoding is applied in the final stage.

Known implementations of cyclic codes do not always adapt well to long codes that are becoming more prevalent in today's communication systems. A case in point is found in commonly owned U.S. patent applicaton No. 11/543,282, where the basic decoding step of computing the syndrome sequence for a binary BCH code can be sped up significantly, particularly in software processing. The present invention is a method for encoding cyclic codes that is more advantageous in any system where word-level exclusive-OR operations are available. The present invention adapts easily to shortened cyclic codes, and so applies to long CRC encoders as well.

Information on the relevant portions of cyclic codes is provided. A linear (n, k) code over a field, F, is best viewed as a k-dimensional space of n-tuples with entries in F. Given a basis for the orthogonal space, the syndrome (with respect to that basis) of an arbitrary n-tuple is then defined as the (n−k)-tuple obtained from computing the dot products with the basis elements in a fixed order. If the elements of the code, called codewords, are the domain for transmitted messages, then checking that the syndrome is zero is a quick way to test whether the arbitrary received vector is in the code. In typical cases, one also interprets a zero syndrome as most likely having resulted from no error in transmission. The confidence in concluding this is a function of the noise model (in particular supposing that a transmission with fewer errors is more likely than one with more errors), and a parameter of the code called the minimum distance. This integer, denoted by d, is simply the least number, among all pairs of distinct codewords, of entry changes needed to interchange the pair; due to linearity, d coincides with the least number of nonzero entries in any (nonzero) codeword. This value plays a role in correction in that the strategy for decoding (when a syndrome is nonzero) is to choose the codeword that can be obtained from the fewest number of changed entries, again following the general noise model. The choice of "nearest" codeword is guaranteed to be unambiguous when the number of errors is less than half of the minimum distance; this integer value is called the error-correction capacity of the code, and works out to be $[(d-1)/2]$. In fact, assuming the choice to be unambiguous for any $[(d-1)/2]+1$ errors violates the minimum distance being d.

A cyclic code of length n is simply a linear code that is invariant as a set under cyclic shift of the entries. In algebraic terms, it equates to a nontrivial ideal in the quotient ring $$R_n = \frac{F[x]}{(x^n - 1)}.$$

The connection is that a cyclic shift of the coordinates of c(x) corresponds to the coordinates of xc(x) (mod $x^n-1$). The ideal is principal, and g(x) is used to denote the least degree monic element, called the generator polynomial. Simple Euclidean-algorithm arguments show that for any c(x)∈C, g(x) must divide c(x), and that g(x) must also divide $x^n-1$ in F[x]. As a vector space over F, the set of multiples in $R_n$ has dimension k equal to n−deg(g(x)), since that many consecutive "shifts" $\{x^i g(x) | 0 \leq i \leq n-\deg(g(x))-1\}$ suffice to get all multiples of g(x) in $R_n$, and because they are all needed, meaning that the corresponding shifts must be independent over F.

The most common adaptation of the setting above for encoding is to regard the data as a polynomial m(x) of degree at most k−1; then the check bits appended to these coefficients are derived from (the coefficients of) the remainder $x^{n-k}m(x)$ (mod g(x)). This division is a linear operation on the coefficients of m(x), and can be synthesized as a shift register. The same method is used to compute CRC checksum, which are cyclic codes used for error detection purposes. These often feature overall vector lengths less than the intrinsic algebraic value of n; the "shortening" is effected by suppressing in the processing an appropriate number of "highorder" data bits (which are implicitly set to zero).

A simple way to create a basis for the dual of a cyclic (n, k) code with generator polynomial g(x) is to use cyclic shifts (of the reverse) of the so-called check polynomial:

$$h(x) = \frac{(x^n - 1)}{g(x)},$$

which then has degree k. This is due to the fact that gcd(|F|, n)=1 means no repeated factors in $x^n-1$; thus c(x) is a codeword if and only if c(x)h(x)≡0 (mod $x^n-1$), since this is equivalent to g(x) being a divisor of c(x). The coefficient of $x^j$ in that polynomial product is then:

$$\sum_{i=0}^{n-1} c_i h_{j-1},$$

where the subscripts are read modulo n, to account for the polynomial reduction modulo $x^n-1$. Each of these coefficients must be zero in F.

Suppose that g(x) has degree m. Taking the case of j=n−m, this translates to saying that the coefficient vector for $h^{rev}(x)$ is orthogonal to the codeword corresponding to c(x). Moreover each of the shifts of $h^{rev}(x)$ represents codewords orthogonal to that of c(x), since this is equivalent to shifting c(x) relative to $h^{rev}(x)$. Thus the following represent independent elements of the dual code: $\{h^{rev}(x), xh^{rev}(x), \ldots, x^{m-1}h^{rev}(x)\}$.

Expressed in terms of the coefficients of h(x), the dual basis is then a n−k×n matrix $$H = \begin{bmatrix} h_k & h_{k-1} & h_{k-2} & \ldots & h_0 & 0 & 0 & \ldots & 0 \\ 0 & h_k & h_{k-1} & \ldots & h_1 & h_0 & 0 & \ldots & 0 \\ \ldots & \ldots & \ldots & \ldots & \ldots & & & & 0 \\ 0 & 0 & \ldots & h_k & h_{k-1} & h_{k-2} & \ldots & h_0 & 0 \\ 0 & 0 & \ldots & 0 & h_k & h_{k-1} & \ldots & h_1 & h_0 \end{bmatrix},$$

where k is the dimension of the code, following the standard convention uses $(c_0, c_1, c_2, \ldots, c_{n-1})$ for the coefficients of a codeword c(x).

FIG. 1 is a flowchart of the steps of the present invention.

The first step 1 of the preferred embodiment is selecting a user-definable binary cyclic code. The user-definable binary cyclic code has a user-definable length n and a user-definable dimension k.

The second step 2 of the preferred embodiment is establishing a generator polynomial g(x) having coefficients $(g_0, g_1, g_2, \ldots, g_{n-k})$.

The third step 3 of the present invention is setting number $$h(x) = \frac{(x^n - 1)}{g(x)}$$

with coefficients $(h_0, h_1, h_2, \ldots, h_k)$ and forming $$H = \begin{bmatrix} h_k & h_{k-1} & h_{k-2} & \ldots & h_0 & 0 & 0 & \ldots & 0 \\ 0 & h_k & h_{k-1} & \ldots & h_1 & h_0 & 0 & \ldots & 0 \\ \ldots & \ldots & \ldots & \ldots & \ldots & & & & 0 \\ 0 & 0 & \ldots & h_k & h_{k-1} & h_{k-2} & \ldots & h_0 & 0 \\ 0 & 0 & \ldots & 0 & h_k & h_{k-1} & \ldots & h_1 & h_0 \end{bmatrix}.$$

The fourth step 4 of the preferred embodiment is receiving data to be encoded. The data has coefficients $(a_1, a_2, \ldots, a_k)$.

The fifth step 5 of the preferred embodiment is appending (n−k) zeros to the received data forming an n-long vector, $\vec{r} = (0, 0, \ldots, a_1, a_2, \ldots, a_k)$.

The sixth step 6 of the preferred embodiment is calculating the binary syndrome $\vec{s} = H\vec{r}^t$ by performing an exclusive-OR function of (n−k) segments of $(r_0, r_1, r_2, \ldots, r_{n-1})$ according to the coefficients $(h_0, h_1, h_2, \ldots, h_k)$. That is to say, for each $h_i=1$, add in $(r_{k-i}, r_{k-i+1}, r_{k-i+2}, \ldots, r_{n-i+1})$. It is worth noting that the structure of $\vec{r}$ means that there is no point in adding the segment for $h_k=1$, since it is always zero.

The seventh step 7 of the preferred embodiment is calculating the (n−k) check values $L\vec{s}^t$. In this step, $$L = \begin{bmatrix} g_{n-k} & g_{n-k-1} & g_{n-k-2} & \ldots & g_1 \\ 0 & g_{n-k} & g_{n-k-1} & \ldots & g_2 \\ 0 & 0 & & \ldots & \ldots \\ 0 & 0 & \ldots & g_{n-k} & g_{n-k-1} \\ 0 & 0 & \ldots & 0 & g_{n-k} \end{bmatrix}.$$

The eighth step 8 of the preferred embodiment is appending the received data with the (n−k) check values calculated in the seventh step.

The ninth, and last step 9, is encoding the received data using the generator polynomial established in the second step.

The following example will illustrate the present invention described above.

Set n=15, and $g(x)=x^8+x^7+x^6+x^4+1$, which gives a (15,7,5) BCH code. Then $h(x)=x^7+x^6+x^4+1$, and the top row of H is (1 1 0 1 0 0 0 1 0 0 0 0 0 0 0). Given a vector $\vec{r}=(r_0, r_1, r_2, \ldots, r_{14})$, applying H equates to vector addition of the following 8-tuples, representing shifts of $(r_0, r_1, r_2, r_{14})$:

$r_1 r_2 r_3 r_4 r_5 r_6 r_7 r_8$ $r_3 r_4 r_5 r_6 r_7 r_8 r_9 r_{10}$ $r_7 r_8 r_9 r_{10} r_{11} r_{12} r_{13} r_{14}$

Note that the usual contribution from the $x^7$ term is omitted (it would be $(r_0, r_1, r_2, \ldots, r_7)$, which is all-zero, as it represents the 0-bits adjoined to the seven data bits $(r_8, r_9, r_{10}, r_{11}, r_{12}, r_{13}, r_{14})$). This is an instance of example noted in the sixth step 6 above.

By way of example, we wish to encode (0 1 1 1 0 0 0). Append eight zeros to form $\vec{r}$. Computing $H\vec{r}^t$ with the method given yields (0 0 1 1 1 0 1 1). Finally, apply the matrix $$L = \begin{bmatrix} 1 & 1 & 1 & 0 & 1 & 0 & 0 & 0 \\ 0 & 1 & 1 & 1 & 0 & 1 & 0 & 0 \\ 0 & 0 & 1 & 1 & 1 & 0 & 1 & 0 \\ 0 & 0 & 0 & 1 & 1 & 1 & 0 & 1 \\ 0 & 0 & 0 & 0 & 1 & 1 & 1 & 0 \\ 0 & 0 & 0 & 0 & 0 & 1 & 1 & 1 \\ 0 & 0 & 0 & 0 & 0 & 0 & 1 & 1 \\ 0 & 0 & 0 & 0 & 0 & 0 & 0 & 1 \end{bmatrix},$$

to obtain check bits (0 0 0 1 0 0 0 1), which are appended to the original data (0 1 1 1 0 0 0) as check bits. As a polynomial, this represents $x^3 g(x)=x^3+x^7+x^9+x^{10}+x^{11}$ which confirms these are the correct check bits in this instance.

The present invention is relevant for high-rate codes, meaning that n−k is small compared to k. Beyond this, the computational advantage of the present invention benefits from using word-level exclusive-OR's for calculating $H\vec{r}^t$ as described above. For long codes, the parallelism has been found to offer substantial improvements over prior art methods, which require calculation of the remainder $x^{n-k}m(x)$ (mod g(x)).

The following mathematical theorems demonstrate the correctness of the method described above.

Lemma: Suppose $x^n - 1 = g(x)h(x)$ in $GF(2)[x]$, with $k = \text{degree}(h(x)) \geq \text{degree}(g(x)) - 1$. Then the following binary matrix identity involving the coefficients of $g(x)$ and $h(x)$ holds:

$$\begin{bmatrix} g_{n-k} & g_{n-k-1} & g_{n-k-2} & \cdots & g_1 \\ 0 & g_{n-k} & g_{n-k-1} & \cdots & g_2 \\ 0 & 0 & \cdots & \cdots & \cdots \\ 0 & 0 & \cdots & & g_{n-k-1} \\ 0 & 0 & \cdots & 0 & g_{n-k} \end{bmatrix} \begin{bmatrix} h_k & h_{k-1} & h_{k-2} & \cdots & h_{2k-n+1} \\ 0 & h_k & h_{k-1} & \cdots & h_{2k-n} \\ 0 & 0 & \cdots & \cdots & \cdots \\ 0 & 0 & & h_k & h_{k-1} \\ 0 & 0 & \cdots & 0 & h_k \end{bmatrix} = I_{n-k}$$

Proof: Recall first from the description above that all cyclic shifts of the two n-long binary vectors ($h_k$, $h_{k-1}$, $h_{k-2}$, ..., $h_0$, 0, 0, ..., 0) and ($g_0$, $g_1$, $g_2$, ..., $g_{n-k}$, 0, 0, ..., 0) must have dot product of zero in GF(2). One such dot product will have entries aligned as follows:

$h d_k h_{k-1} h_{k-1} \ldots h_0 \, 0 \, 0 \ldots 0$ $g_{n-k} \, 0 \, 0 \ldots g_0 g_1 g_2 \ldots g_{n-k-1}$ From $x^n - 1 = g(x)h(x)$, it follows that $1 = h_0 = g_0 = h_k = g_{n-k}$. All of the dot products involved in the matrix identity derive from: (1) setting $g_0 = 0$ (since it does not appear in the matrix) and (2) the pairing shown, or one involving the first $n-k-1$ right cyclic shifts of the second row. Initially, the $g_0$-position (reset to 0) is paired with a 1 in the top row, so that the resulting dot product will be 1. For the remaining $n-k-1$ shifts, the $g_0$-position will be paired with one of the $n-k-1$ 0's to the right of the $h_0$ entry; thus the off-diagonal of the product is all zero. The diagonal entries are all simply $h_k g_{n-k} = 1$.

The following theorem is provided to justify the method described above appends the correct bits.

Suppose $x^n - 1 = g(x)h(x)$ in $GF(2)[x]$, with $k = \text{degree}(h(x)) \geq \text{degree}(g(x)) - 1$. Let H be the $(n-k) \times n$ binary matrix formed as above from the first $n-k$ shifts of the n-long vector associated with $h^{rev}(x)$: ($h_k$, $h_{k-1}$, $h_{k-2}$, ..., $h_0$, 0, 0, ..., 0). Suppose the coefficients of $g(x)$ are ($g_0$, $g_1$, ..., $g_{n-k}$). Given any binary k-tuple, ($a_1$, $a_2$, ..., $a_k$), append $n-k$ zeros, forming $\vec{r} = (0, 0, \ldots 0, a_1, a_2, \ldots, a_k)$. If one calculates $\vec{s} = H \vec{r}^{\,t}$, followed by $(b_1, b_2, \ldots, b_{n-k}) = L \vec{s}^{\,t}$, where $$L = \begin{bmatrix} g_{n-k} & g_{n-k-1} & g_{n-k-2} & \cdots & g_1 \\ 0 & g_{n-k} & g_{n-k-1} & \cdots & g_2 \\ 0 & 0 & \cdots & \cdots & \cdots \\ 0 & 0 & & & g_{n-k-1} \\ 0 & 0 & \cdots & 0 & g_{n-k} \end{bmatrix}.$$

Then $\vec{c} = (b_1, b_2, \ldots, b_{n-k}, a_1, a_2, \ldots, a_k)$ is a codeword in the cyclic (n, k) code with generator polynomial $g(x)$.

Proof: Observe that the matrix LH has the form $(I_{n-k}|M)$, where $I_{n-k}$ is the $(n-k) \times (n-k)$ identity matrix, because of the lemma. Observe also that the rowspace of LH is the same as the rowspace of H, and so is a basis for the dual code. Likewise the $k \times n$ matrix $(M^t | I_k)$ forms a basis for the cyclic code generated by $g(x)$, since all of its rows have dot product zero with the rows of $(I_{n-k}|M)$. In particular, the product $(a_1, a_2, \ldots, a_k)(M^t|I_k)$ is the desired codeword, with data bits in the rightmost k positions. Since the first $(n-k)$ entries of $\vec{r}$ are zero, the computation of $LH \vec{r}^{\,t}$ simply sums the columns of the $(n-k) \times k$ matrix M, as determined by the nonzero entries of $\vec{r}$; but this coincides with the sum of rows of $M^t$ the product $(a_1, a_2, \ldots, a_k)(M^t|I_k)$.

Figure 2:
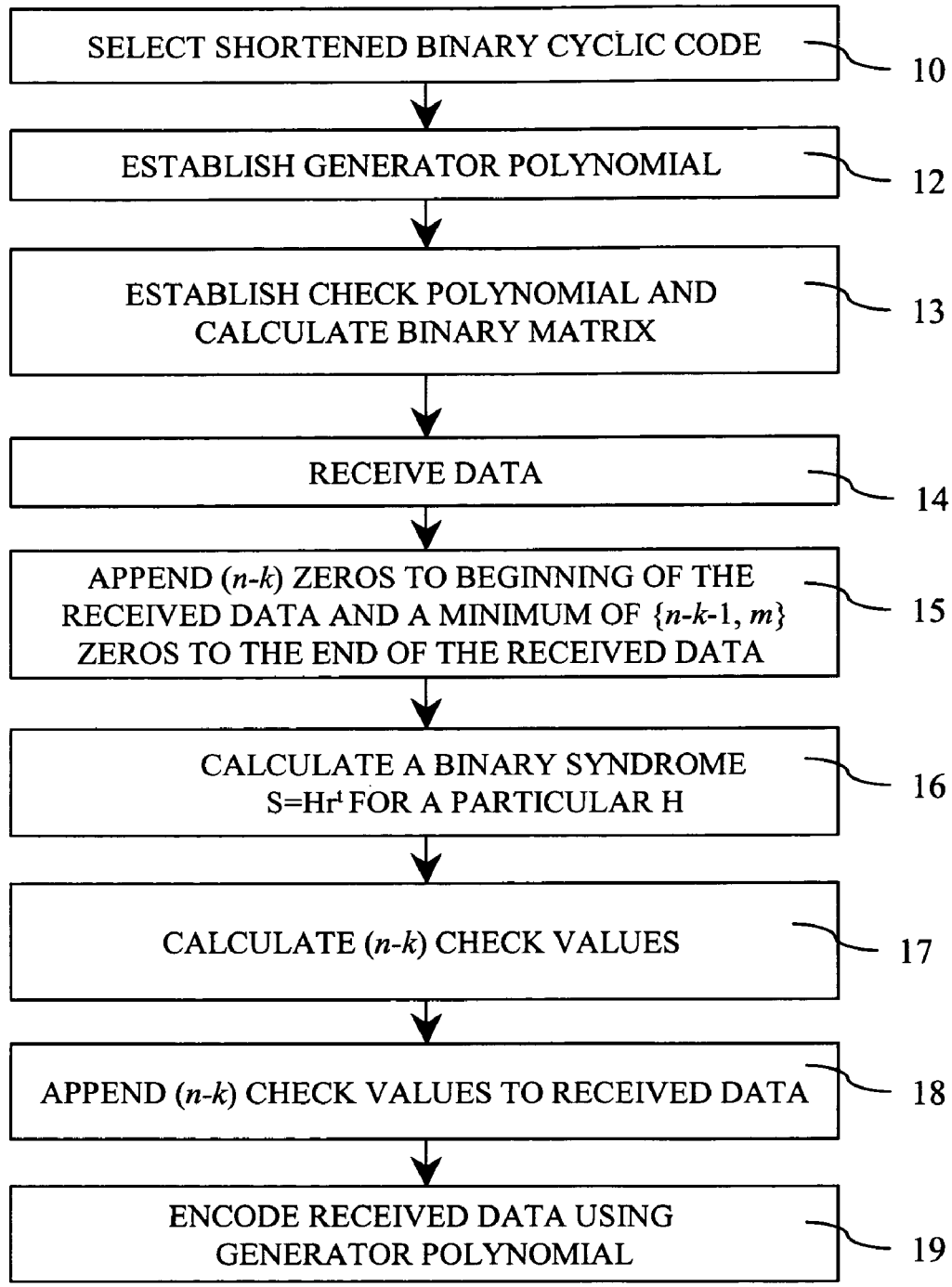
FIG. 2 is a flowchart of an alternate embodiment.

FIG. 2 shows a flowchart of an alternate embodiment for shortened cyclic codes.

The adjustments needed for a shortened code are explained in greater detail below. Suppose as described above that we seek to encode a binary cyclic code with length n and dimension k, has generator polynomial $g(x)$. Suppose also that the code has been shortened by a total of $m < k$ bits by implicitly treating the high-order m data bits to be zero. This is quite common in Cyclic Redundancy Check codes (CRC's).

The first step 10 of the alternate embodiment is selecting a user-definable shortened binary cyclic code. The user-definable binary cyclic code has a user-definable length n, a user-definable dimension k, and is shortened by a total of $m < k$ bits, where m are high-order data bits, wherein the m high-order data bits are processed as zeros.

The second step 12 of the alternate embodiment is establishing a generator polynomial $g(x)$ having coefficients ($g_0$, $g_1$, $g_2$, ..., $g_{n-k}$).

The third step 13 of the alternate embodiment is setting number $$h(x) = \frac{(x^n - 1)}{g(x)}$$

with coefficients ($h_0$, $h_1$, $h_2$, ..., $h_k$) and $$\text{forming } H = \begin{bmatrix} h_k & h_{k-1} & h_{k-2} & \cdots & h_0 & 0 & 0 & \cdots & 0 \\ 0 & h_k & h_{k-1} & \cdots & h_1 & h_0 & 0 & \cdots & 0 \\ \cdots & \cdots & \cdots & \cdots & \cdots & & & \cdots & 0 \\ 0 & 0 & \cdots & h_k & h_{k-1} & h_{k-2} & \cdots & h_0 & 0 \\ 0 & 0 & \cdots & 0 & h_k & h_{k-1} & \cdots & h_1 & h_0 \end{bmatrix}.$$

The fourth step 14 of the alternate embodiment is receiving data to be encoded, the data having the coefficients ($a_1$, $a_2$, ..., $a_k$).

The fifth step 15 of the alternate embodiment is appending $(n-k)$ zeros in front of the received data and the minimum $\{n-k-1, m\}$ zeros to the end of the received data, forming an n-long vector, $\vec{r} = (0, 0, \ldots, a_1, a_2, \ldots, a_k)$.

The sixth step 16 of the alternate embodiment is calculating the binary syndrome $\vec{s} = H \vec{r}^{\,t}$ by performing an exclusive-OR function of $(n-k)$ segments of ($r_0$, $r_1$, $r_2$, ..., $r_{n-1}$) according to the coefficients ($h_0$, $h_1$, $h_2$, ..., $h_k$).

The difference for shortened codes begins with the fifth step 15. The calculation of $H \vec{r}^{\,t}$ may involve fewer steps than the un-shortened code in that some terms of h(x) may contribute only zero-blocks (if the implicit data zeros had not been suppressed). The simplest way to explain this is to generate the coefficients of h(x) from the recursion implicit in g(x). Consider a linear recursion based on g(x). If this begins with the impulse state 0 0 ... 0 1, the feedback values following this will be: $h_{k-1}$, $h_{k-2}$, ..., since $h^{rev}(x)$ is the least degree element of the orthogonal space. The process can be depicted as a sliding "window" of $n-k$ bits advancing through ($r_0$, $r_1$, $r_2$, ..., $r_{n-1}$), starting at the left. For each of the feedback values that are a one, the contents of the window are exclusive-OR'd to contribute to the calculation of $H\vec{r}^t$. Since $h_k=1$, the contribution is $(r_0, r_1, r_2, \ldots, r_{n-k-1})$, which as mentioned is all zero by construction, in the current context. If $h_k-1=1$ contributes $(r_1, r_2, r_3, \ldots, r_{n-k})$, and so on. Now for a shortened code, the process may stop before all of the coefficients of h(x) are calculated, simply because the window reaches the end of the stream. For maximum speed in actual implementations, the indices where $h_i=1$ would be computed as one-time work for that particular length. Then, the window can select only those (n–k)-tuples needed from $\vec{r}$.

The seventh step 17, the eighth step 18, and the ninth step 19 of the alternate embodiment are as described above for the preferred embodiment.

As an example, consider the CCITT standard, $g(x)=1+x^5+x^{12}+x^{16}$. The "natural length" of the cyclic code associated with this is $2^{15}-1=32,767$, allowing for data size up to 32,751 bits.

In practical applications known to persons skilled in the art, the code is shortened. For simplicity, suppose length 35 is used instead. To the 19 data bits, 15 zeroes must be appended, as described above, for a total of 50 bits. Using g(x) as a recursion, with an initial state of 0 0 0 0 0 0 0 0 0 0 0 0 0 0 0 1, the first 34 feedback values are then 0 0 0 1 0 0 0 1 0 0 1 1 0 0 0 0 0 0 1 1 0 1 0 0 0 1 1 1 0 0 0 1 1 0.

Following the description above, $H\vec{r}^t$ is obtained from an exclusive-OR of the 16-bit segments $(r_i, r_{i+1}, r_{i+2}, \ldots, r_{i+15})$, with i=4, 8, 11, 12, 19, 20, 22, 26, 27, 28, 32, 33. This approach saves the calculation of terms of h(x) that will not be needed. As before, the check bits to append to 19 data bits would be derived from multiplying by the 16×16 upper-triangular matrix L, with top row: 1 0 0 0 1 0 0 0 0 0 1 0 0 0 0, as described above.

While the preferred embodiments of the invention have been illustrated and described, it will be apparent to those of ordinary skill in the art that various changes and modifications may be made without deviating from the inventive concepts set forth above.

What is claimed is:

1. A method of encoding a signal on a computer, comprising the steps of:
   a) selecting a user-definable binary cyclic code, the user-definable binary cyclic code having a user-definable length n and a user-definable dimension k;
   b) establishing a generator polynomial g(x) having coefficients $(g_0, g_1, g_2, \ldots, g_{n-k})$;
   c) setting $$h(x) = \frac{(x^n - 1)}{g(x)}$$

with coefficients $(h_0, h_1, h_2, \ldots, h_k)$ and $$\text{forming } H = \begin{bmatrix} h_k & h_{k-1} & h_{k-2} & \ldots & h_0 & 0 & 0 & \ldots & 0 \\ 0 & h_k & h_{k-1} & \ldots & h_1 & h_0 & 0 & \ldots & 0 \\ \ldots & \ldots & \ldots & \ldots & \ldots & & & \ldots & 0 \\ 0 & 0 & \ldots & h_k & h_{k-1} & h_{k-2} & \ldots & h_0 & 0 \\ 0 & 0 & \ldots & 0 & h_k & h_{k-1} & \ldots & h_1 & h_0 \end{bmatrix};$$

d) receiving data to be encoded, the data having the coefficients $(a_1, a_2, \ldots, a_k)$;
   e) appending (n–k) zeros to the received data forming an n-long vector, $\vec{r} = (0, 0, \ldots, a_1, a_2, \ldots, h_k)$;
   f) calculating the binary syndrome $\vec{s} = H\vec{r}^t$ on the computer by performing an exclusive-OR function of (n–k) segments of $(r_0, r_1, r_2, \ldots, r_{n-i})$ according to the coefficients $(h_0, h_1, h_2, \ldots, h_k)$;
   g) calculating the (n–k) check values $L\vec{s}^t$, where $$L = \begin{bmatrix} g_{n-k} & g_{n-k-1} & g_{n-k-2} & \ldots & g_1 \\ 0 & g_{n-k} & g_{n-k-1} & \ldots & g_2 \\ 0 & 0 & & \ldots & \ldots \\ 0 & 0 & \ldots & g_{n-k} & g_{n-k-1} \\ 0 & 0 & \ldots & 0 & g_{n-k} \end{bmatrix};$$

h) appending the received data with the (n–k) check values calculated in step (g); and
   i) encoding the received data on the computer using the generator polynomial established in step (b).

2. A method of encoding a signal using a shortened code on a computer, comprising the steps of:
   a) selecting a user-definable shortened binary cyclic code, the user-definable binary cyclic code having a user-definable length n, a user-definable dimension k, and is shortened by a total of m<k bits, where m are high-order data bits, wherein the m high-order data bits are processed as zeros;
   b) establishing a generator polynomial g(x) having coefficients $(g_0, g_1, g_2, \ldots, g_{n-k})$;
   c) setting $$h(x) = \frac{(x^n - 1)}{g(x)}$$

with coefficients $(h_0, h_1, h_2, \ldots, h_k)$ and $$\text{forming } H = \begin{bmatrix} h_k & h_{k-1} & h_{k-2} & \ldots & h_0 & 0 & 0 & \ldots & 0 \\ 0 & h_k & h_{k-1} & \ldots & h_1 & h_0 & 0 & \ldots & 0 \\ \ldots & \ldots & \ldots & \ldots & \ldots & & & \ldots & 0 \\ 0 & 0 & \ldots & h_k & h_{k-1} & h_{k-2} & \ldots & h_0 & 0 \\ 0 & 0 & \ldots & 0 & h_k & h_{k-1} & \ldots & h_1 & h_0 \end{bmatrix};$$

d) receiving data to be encoded, the data having the coefficients $(a_1, a_2, \ldots, a_k)$;
   e) appending (n–k) zeros in front of the received data and the minimum {n–k–1, m} zeros to the end of the received data, forming an n-long vector, $\vec{r} = (0, 0, \ldots, a_1, a_2, a_k)$;
   f) calculating the binary syndrome $\vec{s} = H\vec{r}^t$ on the computer by performing an exclusive-OR function of (n–k) segments of $(r_0, r_1, r_2, \ldots, r_{n-1})$ according to the coefficients $(h_0, h_1, h_2, \ldots, h_k)$;

g) calculating the (n−k) check values $L\vec{s}^{\,t}$, where $$L = \begin{bmatrix} g_{n-k} & g_{n-k-1} & g_{n-k-2} & \cdots & g_1 \\ 0 & g_{n-k} & g_{n-k-1} & \cdots & g_2 \\ 0 & 0 & & \cdots & \cdots \\ 0 & 0 & \cdots & g_{n-k} & g_{n-k-1} \\ 0 & 0 & \cdots & 0 & g_{n-k} \end{bmatrix};$$

h) appending the received data with the (n−k) check values calculated in step (g); and i) encoding the received data on the computer using the generator polynomial established in step (b).

\* \* \* \* \*